(12) United States Patent
Pupalaikis et al.

(10) Patent No.: US 8,659,315 B2
(45) Date of Patent: Feb. 25, 2014

(54) METHOD FOR PRINTED CIRCUIT BOARD TRACE CHARACTERIZATION

(75) Inventors: Peter J Pupalaikis, Ramsey, NJ (US); Kaviyesh Doshi, Emerson, NJ (US)

(73) Assignee: Teledyne LeCroy, Inc., Thousand Oaks, CA (US)

( * ) Notice: Subject to any disclaimer, the term of this patent is extended or adjusted under 35 U.S.C. 154(b) by 163 days.

(21) Appl. No.: 13/438,955

(22) Filed: Apr. 4, 2012

(65) Prior Publication Data

US 2013/0265079 A1 Oct. 10, 2013

(51) Int. Cl.
*G01R 31/26* (2006.01)

(52) U.S. Cl.
USPC .............. 324/763.01; 702/182; 702/126

(58) Field of Classification Search
None
See application file for complete search history.

(56) References Cited

U.S. PATENT DOCUMENTS

| | | | |
|---|---|---|---|
| 7,659,791 B2* | 2/2010 | Park et al. | 333/1 |
| 7,805,265 B2* | 9/2010 | Namba et al. | 702/65 |
| 7,877,217 B2* | 1/2011 | Dankner | 702/35 |
| 8,264,249 B2* | 9/2012 | Lee et al. | 324/756.03 |
| 8,431,834 B2* | 4/2013 | Twardy et al. | 174/266 |

OTHER PUBLICATIONS

Bockelman, David E., et al., "Combined Differential and Common-Mode Scattering Parameters: Theory and Simulation", *IEEE Transactions on Microwave theory and techniques*, vol. 43, No. 7, (Jul. 1995), 1530-1539.

Pupalaikis, Peter J., "Method for De-Embedding in Network Analysis", U.S. Appl. No. 13/163,914, (Jun. 20, 2011),1-55.

"IPC-TM-650 Test Methods Manual, Section 2.5.5.12", *IPC*, (May 2009),1-20.

Loyer, Jeff et al., "SET2DIL: Method to Derive Differential Insertion Loss from Single-Ended TDR/TDT Measurements", *Designcon 2010*, (2010),1-23.

Marquardt, Donald W., "An Algorithm for Least-squares Estimation of Nonlinear Parameters", *Journal of the Society for Industrial and Applied Mathematics* vol. 11, No. 2, (Jun. 1963),431-441.

Madsen, K et al., "Methods for Non-Linear Least Squares Problems", *2nd Edition IMM—Informatics and Mathematical Modelling* Technical University of Denmark, (Apr. 2004),1-30.

* cited by examiner

*Primary Examiner* — Jermele M Hollington
*Assistant Examiner* — Trung Nguyen
(74) *Attorney, Agent, or Firm* — Gordon Kessler

(57) ABSTRACT

A method is provided which measures PCB trace characteristics from measurements of a PCB trace structure.

18 Claims, 5 Drawing Sheets

METHOD FOR PRINTED CIRCUIT BOARD TRACE CHARACTERIZATION

FIELD OF THE INVENTION

The present invention relates in general to the measurement of electrical characteristics of printed circuit boards, and more particularly to the testing of one or more characteristics required for traces that propagate high-speed signals as encountered in serial data communications.

BACKGROUND OF THE INVENTION

The printed circuit board (PCB) is an element in many electronic products that contain electronic components. The PCB holds components and connects these components electrically through metal traces. In some applications, especially high speed serial data communications, high quality traces are required. Thus the characteristics of these metal traces must be measured and tested to ensure high quality.

Until relatively recently, the determination PCB and PCB trace quality meant the determination of the ability to handle current or voltage and or electrical resistance. As of late, however, many high-speed PCB traces are tested for characteristic impedance and very lately, methods have been proposed and utilized for measuring loss.

Characteristic impedance is a characteristic of a trace that is dependent on dimensions and material characteristics of the trace and is an electromagnetic aspect that is usually interesting only at relatively high frequencies. It is defined as the square-root of the ratio of inductance to capacitance for a given unit length of trace. When elements in the path of a high-speed signal have different characteristic impedances, reflections occur which may degrade communications. When a trace is excessively lossy signals may be attenuated at high frequencies and again, the communications capability is degraded.

As trace characteristics are dependent both on dimensions and material characteristics of the trace and board, the traditional method of maintaining quality has been for PCB manufacturers to maintain dimensional, mechanical, and chemical property specifications, and for the PCB customers to choose materials and specify dimensions that ensure the desired characteristics. These traditional methods have been less successful as of late, especially when the traces are to be used with high speed data transfers. Many PCB customers and even silicon chip producers to PCB customers are demanding electrical trace characteristics measurements during board construction.

There are several problems with this situation. First, for many PCB manufacturers, high-frequency electrical characteristics are a domain of engineering that is foreign to them. Next, the measurement of high-frequency characteristics are difficult and often time consuming. Finally, the equipment needed to perform these measurements is very expensive.

The industry needs methods that are fast, easy, and economical.

Driven by this need, companies have produced instruments, probes, algorithms and software for these measurements and standards bodies have created measurement standards and methods such as IPC-TM-650 available from the Institute for Interconnecting and Packaging Electronic Circuits (IPC).

Recently, a method has been created and proposed for making measurements called single-ended to differential insertion loss (SE2DIL) (also called SET2DIL). The details of this measurement have been provided in J. Loyer & R. Kuntze, "SET2DIL: Method to Derive Differential Insertion Loss from Single-ended TDR/TDT Measurements", DesignCon, 2010. This method provides for measurement of differential insertion loss by taking a single single-ended measurement of a differential trace with a specified structure. The method prefers time-domain reflectometry (TDR) and time domain transmission (TDT) methods, but it is well known that equivalent vector network analyzer (VNA) measurements can be used by simply converting the measured s-parameters from the VNA to the time-domain. TDR/T instruments tend to be less expensive and more familiar to PCB manufacturers. VNA instruments tend to be more expensive and less familiar to PCB manufacturers. Because of the ability to measure loss using a single single-ended two-port measurement, the method is relatively fast and requires only a two-port VNA or TDR instrument, which is really the key aspect as the measurements facilitated by SE2DIL could be made easily with a four-port instrument and a four-port measurement test structure, albeit with more test instrument cost, complexity and time.

Section 2.5.5.12 of IPC-TM-650 provides various test methods to determine the amount of signal loss on printed circuit boards. Currently, there are four methods recommended for determining such signal loss, with SE2DIL being proposed as a fifth method.

One problem with the SE2DIL method is that it is somewhat of an adhoc, algorithmic approach. It has been found that there are many parameters in the algorithm that must be tweaked to get good repeatable results and that there are dependencies on characteristics of measurement instruments that are not entirely understood. Despite this, empirical tests have been performed and indications are that it performs satisfactorily. A method with mathematic and measurement rigor is, however, preferable and a new method meeting this criteria would be more useful. While other methods exist for fully determining electrical characteristics of PCB traces, SE2DIL concerns itself with loss only.

What is needed is a method with mathematic and measurement rigor that can determine more PCB trace characteristics that also has the fast, inexpensive and easy characteristics of SE2DIL.

OBJECTS OF THE INVENTION

It is an object of this invention to preferably provide a fast, easy and economical method for providing PCB trace characteristics measurements. It is further an object of this invention to preferably facilitate the utilization of the same test coupon structures and probing arrangements as recommended by SE2DIL. It is a further object to preferably provide an alternate calculation method capable of providing the same intended result of SE2DIL along with additional PCB trace characteristics.

Still other objects and advantages of the invention will in part be obvious and will in part be apparent from the specification and drawings.

SUMMARY OF THE INVENTION

In order to provide a fast, easy and economical method for providing PCB trace characteristics, the present method may utilize a single, or two test structures. A first of these two test structures (which is optional) is a structure called a termination characterization structure that may be utilized to characterize a termination. It is optional because rather than employing such a test structure, the termination may alternatively be satisfactorily characterized through simulation, or its characteristics can be assumed. The second test structure, called the trace characterization structure consists of the device under test (DUT) cascaded with a termination assumed to match the characteristics of the termination in the termination characterization structure.

The DUT is assumed to be a differential transmission line, usually microstrip, stripline, or some other structure, although there are extensions of the embodiment to single-ended transmission line structures and the like, and the various embodiments of the invention should be considered applicable thereto as well.

Given two-port measurements of the trace characterization structure, either through TDR/T or VNA methods, the present method calculates the characteristics of the DUT.

Since there is not enough information in the two-port measurement to determine the characteristics of an arbitrary four-port device that the DUT represents, assumptions are preferably made regarding reciprocity and symmetry.

The inventors have determined that a good model of the DUT is as a symmetric, reciprocal element and particularly as an element that transmits two modes and that no mode-conversion takes place thereby simplifying the problem into two independent mixed-mode problems consisting of two one-port measurements of two two-port DUTs, one for differential- and the other for common-mode.

The inventors have further determined that with a transmission line model consisting of frequency dependent reflection-coefficient, loss, and delay, the reflection-coefficient can be isolated by conversion of a one-port modal measurement to the time-domain and restricting the length of the time-domain response. Once the reflection-coefficient is isolated, loss and delay measurements are easily obtained and the DUT may be fully characterized.

The measurements made of these transmission line models may be optionally converted to single-ended measurements. The measurements facilitate the determination of trace impedance in mixed-mode or single-ended and facilitate loss and electrical length measurements. Fitting is performed to further convert loss measurements to metrics that provide loss per frequency, loss per square-root of frequency, and further to losses that are frequency and length dependent. The method makes similar provisions for electrical length and propagation velocity which facilitates the determination of other important PCB and PCB trace characteristics.

The present method provides for refining the measurements made through the fitting of the measurement to a single-ended model of the DUT enabling the matching of the calculated DUT to the measurements in a least-squares error sense. This fitting also allows metrics, such as variance, that provide metrics on the quality of the measurement and the quality of the assumptions made regarding symmetry, reciprocity and lack of mode-conversion assumed in the model.

The invention accordingly comprises the several steps and the relation of one or more of such steps with respect to each of the others, and the apparatus embodying features of construction, combinations of elements and arrangement of parts that are adapted to affect such steps, all is exemplified in the following detailed disclosure, and the scope of the invention will be indicated in the claims.

BRIEF DESCRIPTION OF THE DRAWINGS

For a more complete understanding of the invention, reference is made to the following description and accompanying drawings, in which.

DETAILED DESCRIPTION OF THE PREFERRED EMBODIMENTS

Figure 1:
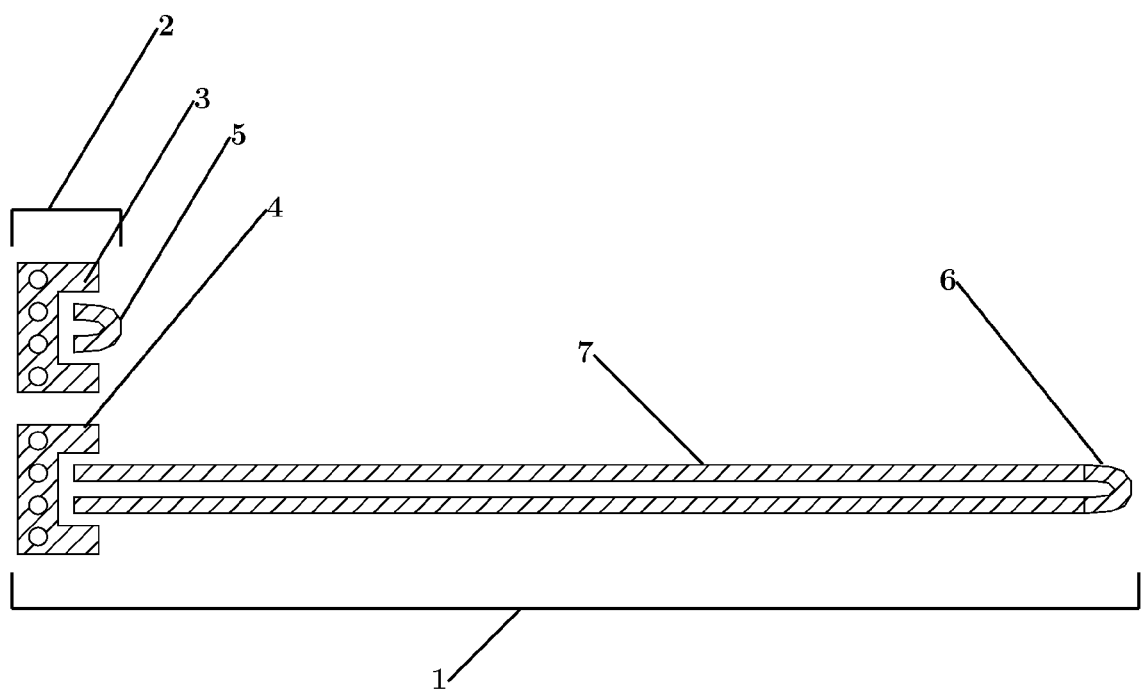
FIG. 1 shows the PCB trace structures utilized by prior-art methods for making PCB loss measurements.
Figure 2:
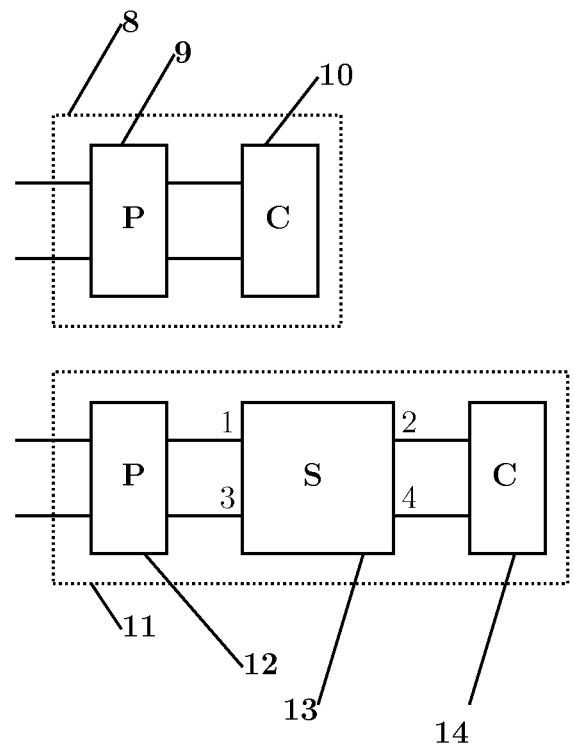
FIG. 2 is a block diagram showing the measurement problem.

FIG. 1 shows elements of an exemplary test-coupon that may be employed for a PCB trace characterization measurement. It shows a trace characterization structure [1] and a termination characterization structure [2]. Both structures [1],[2] are intended to be substantially similar in that each contains a probing structure [3], [4] and a termination structure [5], [6] except that the trace characterization structure [1] contains a differential trace element [7] which is the DUT and is the element to be characterized.

The intent of the structures in FIG. 1 is that measurements are obtained for the trace characterization structure [1] and for the termination characterization structure [2] by probing and measuring each one. Based on these measurements, one or more characteristics of the DUT may be obtained.

Assuming that the termination structures [5], [6] are substantially similar and that a good measurement can be made of the termination structure [5] by measuring at the termination characterization structure [2], the algorithm problem for determining the characteristics of the DUT is shown in FIG.

2. A block diagram representation of the structures is provided in FIG. 1 where, for a given frequency, P refers to the probe, S refers to the DUT and C refers to the termination structure.

The top network [8] represents a two-port network consisting of a four-port probe [9] and a two-port termination [10]. It exposes two-ports representing the fact that it is possible to take a two-port measurement of the aggregate network.

The bottom network [11] represents a two-port network consisting of a four-port probe [12], a four-port DUT [13] and a two-port termination [14].

The termination elements [10], [14] are assumed to be substantially the same. The probe elements [9], [12] are ideally substantially the same, but there are ways of dealing with differences using various calibration methods, as will be described below. It is an object to determine the unknown DUT [13] from measurements of the top network [8] and the bottom network [11].

Ignoring for the moment the problem of determining the characteristics of the probe elements [9], [12] and assume for the moment that direct measurements are possible of the top [8] and bottom networks [11] without the probe elements and that the bottom network termination [14] is the same as the top network termination [10]. In these circumstances, the measurement of the top network [8] is a direct measurement of C and the problem reduces to the determination of the DUT [13] given a measurement of the bottom network [11] and the knowledge of C.

Figure 3:
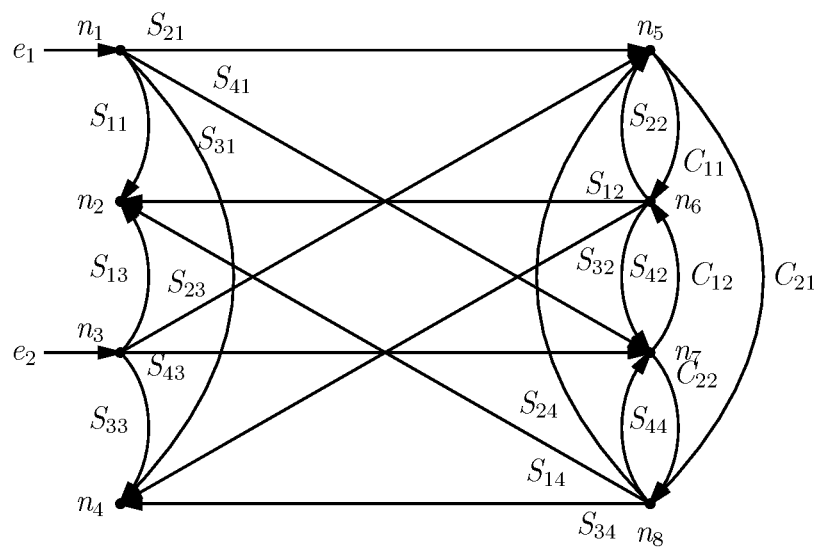
FIG. 3 is a signal-flow diagram showing the measurement problem.

The measurement of the bottom network [11] is a two-port network measurement which contains four s-parameters, or in other words, four equations. The unknown DUT [13] is a four-port network and therefore contains sixteen unknown s-parameters. So there is an under-constrained system of four equations with sixteen unknowns. FIG. 3 demonstrates the problem for a given frequency point from a signal-flow diagram standpoint. Given s-parameter measurements at nodes $n_1$, $n_2$, $n_3$, and $n_4$, one knows the relationship between reflected waves at $n_2$ and $n_3$ with respect to incident waves $e_1$ at node $n_1$ and $e_2$ at node $n_3$. If M represents, for a given frequency, two-port s-parameter measurements of the trace structure where nodes $n_1$ and $n_2$ represent port 1 and $n_3$ and $n_4$ represent port 2, then $M_{11}$ is the value at node $n_2$ and $M_{21}$ is the value at node $n_4$ when $e_1=1$ and $e_2=0$. Similarly $M_{12}$ is the value at node $n_2$ and $M_{22}$ is the value at node $n_4$ when $e_1=0$ and $e_2=1$. This is what is meant by four equations. If the flow diagram is solved, these four values in M are found to be functions of the sixteen unknown s-parameters S and the presumed known s-parameters of the termination C.

A first step that can be taken to solve this problem is to convert the problem from single-ended to mixed-mode. Mixed-mode s-parameters are well known to those skilled in the art of signal integrity (SI) and are described in D. E. Bockelman and W. R. Eisenstadt, Combined Differential and Common-mode Scattering Parameters: Theory and Simulation, IEEE Trans. Microwave Theory Tech., vol. 43 (July 1995), pp. 1530-1539. Without loss of generality, certain port numbering may be enforced so that certain equations may be directly employed. If, for a two-port network with single-ended s-parameters denoted by E, it is enforced that port 1 is the positive port and port 2 is the negative port associated with an equivalent mixed-mode device whose mixed-mode s-parameters are denoted by M and whose port 1 is the differential-mode port and port 2 is the common-mode port, then these s-parameters are related by (1) and (2).

$$\frac{1}{2}\begin{pmatrix} 1 & -1 & -1 & 1 \\ 1 & 1 & -1 & -1 \\ 1 & -1 & 1 & -1 \\ 1 & 1 & 1 & 1 \end{pmatrix} \vec{E} = \vec{M} \quad (1)$$

$$\left[\frac{1}{2}\begin{pmatrix} 1 & -1 & -1 & 1 \\ 1 & 1 & -1 & -1 \\ 1 & -1 & 1 & -1 \\ 1 & 1 & 1 & 1 \end{pmatrix}\right]^{-1} \vec{M} = \vec{E} \quad (2)$$

Similarly if, for a four-port network with single-ended s-parameters denoted by E, it is enforced that ports 1 and 2 are the left and right, respectively positive ports and that ports 3 and 4 are the left and right, respectively negative ports associated with an equivalent mixed-mode device whose mixed-mode s-parameters are denoted by M and whose ports 1 and 2 are the left and right, respectively differential-mode ports and whose ports 3 and 4 are the left and right, respectively common-mode ports, then these s-parameters are related by (3) and (4).

$$\frac{1}{2}\begin{pmatrix} 1 & 0 & -1 & 0 & 0 & 0 & 0 & 0 & -1 & 0 & 1 & 0 & 0 & 0 & 0 & 0 \\ 0 & 1 & 0 & -1 & 0 & 0 & 0 & 0 & 0 & -1 & 0 & 1 & 0 & 0 & 0 & 0 \\ 1 & 0 & 1 & 0 & 0 & 0 & 0 & 0 & -1 & 0 & -1 & 0 & 0 & 0 & 0 & 0 \\ 0 & 1 & 0 & 1 & 0 & 0 & 0 & 0 & 0 & -1 & 0 & -1 & 0 & 0 & 0 & 0 \\ 0 & 0 & 0 & 0 & 1 & 0 & -1 & 0 & 0 & 0 & 0 & 0 & -1 & 0 & 1 & 0 \\ 0 & 0 & 0 & 0 & 0 & 1 & 0 & -1 & 0 & 0 & 0 & 0 & 0 & -1 & 0 & 1 \\ 0 & 0 & 0 & 0 & 1 & 0 & 1 & 0 & 0 & 0 & 0 & 0 & -1 & 0 & -1 & 0 \\ 0 & 0 & 0 & 0 & 0 & 1 & 0 & 1 & 0 & 0 & 0 & 0 & 0 & -1 & 0 & -1 \\ 1 & 0 & -1 & 0 & 0 & 0 & 0 & 0 & 1 & 0 & -1 & 0 & 0 & 0 & 0 & 0 \\ 0 & 1 & 0 & -1 & 0 & 0 & 0 & 0 & 0 & 1 & 0 & -1 & 0 & 0 & 0 & 0 \\ 1 & 0 & 1 & 0 & 0 & 0 & 0 & 0 & 1 & 0 & 1 & 0 & 0 & 0 & 0 & 0 \\ 0 & 1 & 0 & 1 & 0 & 0 & 0 & 0 & 0 & 1 & 0 & 1 & 0 & 0 & 0 & 0 \\ 0 & 0 & 0 & 0 & 1 & 0 & -1 & 0 & 0 & 0 & 0 & 0 & 1 & 0 & -1 & 0 \\ 0 & 0 & 0 & 0 & 0 & 1 & 0 & -1 & 0 & 0 & 0 & 0 & 0 & 1 & 0 & -1 \\ 0 & 0 & 0 & 0 & 1 & 0 & 1 & 0 & 0 & 0 & 0 & 0 & 1 & 0 & 1 & 0 \\ 0 & 0 & 0 & 0 & 0 & 1 & 0 & 1 & 0 & 0 & 0 & 0 & 0 & 1 & 0 & 1 \end{pmatrix} \vec{E} = \vec{M} \quad (3)$$

-continued $$\frac{1}{2}\begin{pmatrix} 1 & 0 & -1 & 0 & 0 & 0 & 0 & 0 & -1 & 0 & 1 & 0 & 0 & 0 & 0 & 0 \\ 0 & 1 & 0 & -1 & 0 & 0 & 0 & 0 & 0 & -1 & 0 & 1 & 0 & 0 & 0 & 0 \\ 1 & 0 & 1 & 0 & 0 & 0 & 0 & 0 & -1 & 0 & -1 & 0 & 0 & 0 & 0 & 0 \\ 0 & 1 & 0 & 1 & 0 & 0 & 0 & 0 & 0 & -1 & 0 & -1 & 0 & 0 & 0 & 0 \\ 0 & 0 & 0 & 0 & 1 & 0 & -1 & 0 & 0 & 0 & 0 & 0 & -1 & 0 & 1 & 0 \\ 0 & 0 & 0 & 0 & 0 & 1 & 0 & -1 & 0 & 0 & 0 & 0 & 0 & -1 & 0 & 1 \\ 0 & 0 & 0 & 0 & 1 & 0 & 1 & 0 & 0 & 0 & 0 & 0 & -1 & 0 & -1 & 0 \\ 0 & 0 & 0 & 0 & 0 & 1 & 0 & 1 & 0 & 0 & 0 & 0 & 0 & -1 & 0 & -1 \\ 1 & 0 & -1 & 0 & 0 & 0 & 0 & 0 & 1 & 0 & -1 & 0 & 0 & 0 & 0 & 0 \\ 0 & 1 & 0 & -1 & 0 & 0 & 0 & 0 & 0 & 1 & 0 & -1 & 0 & 0 & 0 & 0 \\ 1 & 0 & 1 & 0 & 0 & 0 & 0 & 0 & 1 & 0 & 1 & 0 & 0 & 0 & 0 & 0 \\ 0 & 1 & 0 & 1 & 0 & 0 & 0 & 0 & 0 & 1 & 0 & 1 & 0 & 0 & 0 & 0 \\ 0 & 0 & 0 & 0 & 1 & 0 & -1 & 0 & 0 & 0 & 0 & 0 & 1 & 0 & -1 & 0 \\ 0 & 0 & 0 & 0 & 0 & 1 & 0 & -1 & 0 & 0 & 0 & 0 & 0 & 1 & 0 & -1 \\ 0 & 0 & 0 & 0 & 1 & 0 & 1 & 0 & 0 & 0 & 0 & 0 & 1 & 0 & 1 & 0 \\ 0 & 0 & 0 & 0 & 0 & 1 & 0 & 1 & 0 & 0 & 0 & 0 & 0 & 1 & 0 & 1 \end{pmatrix}^{-1} \quad (4)$$

$$\vec{M} = \vec{E}$$

We define a vectorize operator in (5) that serves to stack the columns successively in a vector such that:

$$\overrightarrow{\begin{pmatrix} S_{11} & S_{12} & \cdots & S_{1P} \\ S_{21} & S_{22} & \cdots & S_{2P} \\ \vdots & \vdots & \ddots & \vdots \\ S_{P1} & S_{P2} & \cdots & S_{PP} \end{pmatrix}} = \begin{pmatrix} S_{11} \\ S_{21} \\ \vdots \\ S_{P1} \\ S_{12} \\ S_{22} \\ \vdots \\ S_{P2} \\ \vdots \\ S_{1P} \\ S_{2P} \\ \vdots \\ S_{PP} \end{pmatrix} \quad (5)$$

One can obtain measurements of the termination structure and the trace structure by calibrating to the probe tips. Preferably, this calibration is performed as a second-tier calibration or even more preferably by using methods described in U.S. patent application Ser. No. 13/163,914 to P. Pupalaikis entitled "Method For De-embedding in Network Analysis". This allows measurements to the probe tip reference plane and resolves the probe de-embedding portion of the problem alluded to earlier. The problem then involves converting measurements of the trace structure and the termination structure to measurements of the unknown DUT.

Figure 4:
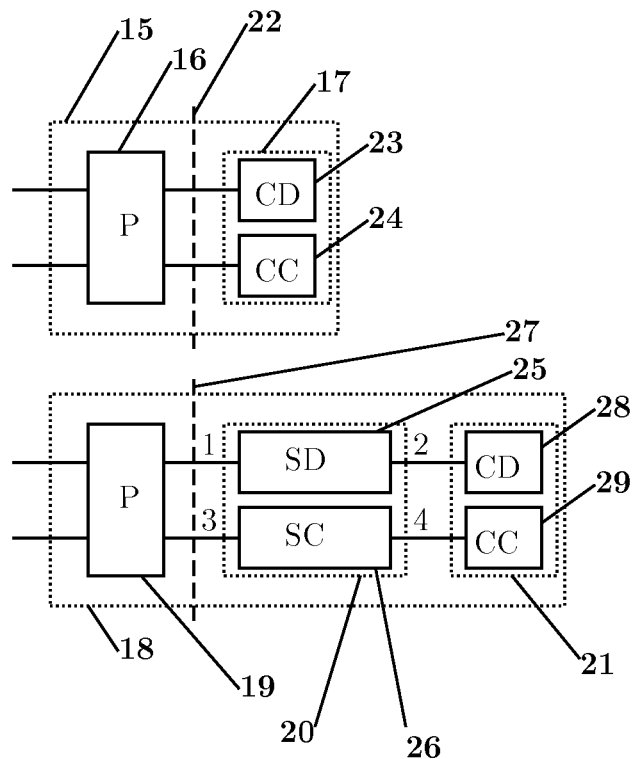
FIG. 4 is a block diagram showing the measurement problem after conversion from single-ended to mixed-mode s-parameters.

FIG. 4 shows a block diagram of the problem once the measurements are converted to mixed-mode. Here we see a block diagram representation of the structures shown in FIG. 1 where P refers again to the probe, SD and SC refer to the differential- and common-mode, respectively s-parameters of the DUT and CD and CC refer to the differential- and common-mode, respectively s-parameters of the termination structure.

The top network [15] at the probe reference plane [22] represents now two one-port networks consisting of the four-port probe [16] and the two-port termination [17] separated into a one-port differential-mode termination [23] with differential-mode s-parameters represented by CD and a one-port common-mode termination [24] with common-mode s-parameters represented by CC. It now exposes two one-port networks at the probe reference plane [22] representing the fact that it is possible to obtain two one-port mixed-mode measurements of the aggregate network.

The bottom network [18] represents a two-port network consisting of a four-port probe [19], a four-port DUT [20] and a two-port termination [21], but now the four-port DUT [20] is separated into two two-port mixed-mode devices with a differential-mode DUT [25] s-parameters represented by SD and a common-mode DUT [26] s-parameters represented by SC. Also, like in the top network [15], the bottom network [18] at the probe reference plane [27] represents now two one-port networks consisting of a four-port probe [16] and now a differential-mode network consisting of a two-port differential-mode DUT [25] connected to a one-port differential-mode termination [28] with differential-mode s-parameters again represented by CD and another common-mode network consisting of a two-port common-mode DUT [26] connected to a one-port common-mode termination [29] with common-mode s-parameters again represented by CC.

The new mixed-mode problem is therefore split into two separate problems for the moment. The first problem is in determining the differential-mode s-parameters of the DUT and the second problem is determining, if desired, the common-mode s-parameters of the DUT. In the differential-mode case, one may now be provided with one-port s-parameters corresponding to the differential-mode measurement of the termination characterization structure and one-port differential-mode s-parameters corresponding to trace characterization structure. Both measurements are, through calibration, de-embedding, or other means, preferably moved to the probe reference planes to form differential-mode measurements of the termination and the combination of the DUT and the termination. One may be provided similar information in the common-mode case.

Figure 5:
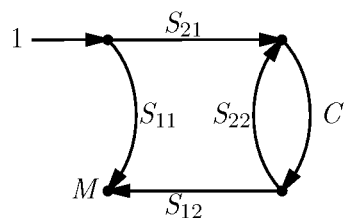
FIG. 5 is a signal flow diagram pertaining to a single mode after conversion to mixed-mode s-parameters.

For each mode, the problem resorts to a signal flow diagram representation as shown in FIG. 5. One may assume knowledge of C given a probe-de-embedded measurement of the termination and knowledge of M given a probe-de-embedded measurement of the combination of the DUT and the termination and that the four s-parameters corresponding to one mode are unknown.

An assumption has already been made that mode-conversion is either not present or insignificant which is a reasonable assumption considering the goal of the measurement. If the DUT was totally arbitrary, this would not be a good assumption, but the DUT is constructed with dimensional symmetry and assumed homogeneity as it is intended to test properties associated with absolute and not relative dimensions and board properties. In other words, while the trace characterization being performed will be measuring effects of errors that can be, but are not limited to items like etch, plating thickness, trace thickness, board thickness and board material and dielectric properties, it is reasonable to assume that errors made in these areas are similar for each portion of the DUT allowing for symmetry to still hold. If this were not reasonable, the usage of a test coupon, which is intended to be substantially representative of other traces in the board, would be of limited use anyway. In any case, in subsequent discussion within this disclosure, opportunity is provided for determining the quality and correctness of these assumptions.

A next step in reduction of unknowns is to assume reciprocity. This is a safe assumption because all passive networks are reciprocal and the goal here is to measure a passive network. Reciprocity means that the transpose of an s-parameter matrix equals itself, or for each reflect port x and incident port y we have $S_{xy}=S_{yx}$. This reduces the number of unknowns to three.

Finally, symmetry is assumed, for the same reason as the assumption of no mode-conversion. Symmetry is an extension of the fact that not only are each single-ended trace in the DUT required to be similar, but for each trace to look the same when viewed from either side. Symmetry in this case implies that $S_{11}=S_{22}$. This reduces the number of unknowns to two.

Figure 6:
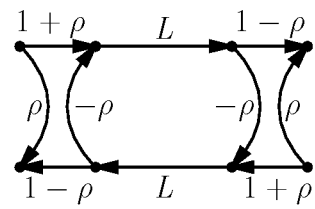
FIG. 6 is signal-flow diagram model of an idealized transmission line section.

The inventors have determined that in dealing with these two unknowns, it is particularly advantageous to consider the DUT as a transmission line (for a given mode) as shown in FIG. 6 where we see that a transmission line can be determined by two-unknowns at a given frequency: ρ and L. This model of a transmission line assumes that it consists of an impedance discontinuity is at each end which is determined by ρ which relates the characteristic impedance of the line $Z_c$ and the arbitrarily chosen reference impedance $Z_0$ which is usually equal to 50Ω through (6):

$$\rho = \frac{Z_c - Z_0}{Z_c + Z_0} \quad (6)$$

The model also assumes that in between the impedance discontinuity at the boundary of the line, that the line is homogeneous with a loss and delay characteristic L given by (7):

$$L = e^\gamma = e^{\alpha+j\beta} = e^\alpha e^{-j2\pi fT} \quad (7)$$

In (7), $e^\alpha$ contains the loss characteristic and $\beta=-2\pi fT$ contains the phase or delay characteristic. α and β combine to form the complex thru coefficient L with the magnitude of L forming the loss characteristic and the argument of L forming the phase characteristic which, when considering the frequency forms the delay characteristic.

Figure 7:
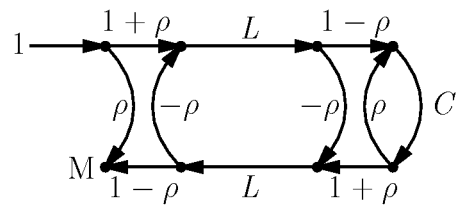
FIG. 7 is a signal-flow diagram pertaining to a single-mode showing the new measurement problem using an idealized transmission line section model.

The model in FIG. 6 still contains two unknowns. When the model in FIG. 6 is substituted into the diagram shown in FIG. 5, the diagram shown in FIG. 7 may be obtained. If M is then solved for, (8) may be obtained:

$$M = \frac{\rho^2 C - \rho + L^2\rho - L^2 C}{L^2\rho^2 - L^2 C\rho + \rho C - 1} \quad (8)$$

Let's consider two cases. The first case has the line infinitely long so that L goes to zero. So:

$$\lim_{L \to 0} M = \frac{\rho^2 C - \rho}{\rho C - 1} = \frac{\rho(\rho C - 1)}{\rho C - 1} = \rho \quad (9)$$

The second case has the line terminated in C=ρ:

$$\lim_{C \to \rho} M = \frac{\rho^3 - \rho + L^2\rho - L^2\rho}{L^2\rho^2 - L^2\rho^2 + \rho^2 - 1} = \frac{\rho(\rho^2 - 1)}{\rho^2 - 1} = \rho \quad (10)$$

One can see that if one could take a measurement of the system with either an infinitely long trace (causing L=0) or with something to absorb all of the wave in the line after the interface or with a termination that matched the line characteristic impedance exactly (causing ρ=C), then one can take a direct measurement of ρ. There is a way to create this effect and that is by not considering the reflection from the end of the structure. This is accomplished in the time domain by eliminating this reflection. To do this, one computes m=IDFT (M). Where IDFT refers to the inverse discrete Fourier transform (IDFT). m is the time-domain equivalent of M which, for a homogeneous line shows an impulse near time zero due to the interface to the transmission line and multiple reflections thereafter at times that are multiples of twice the electrical length of the structure as shown in FIG. 8.

Figure 8:
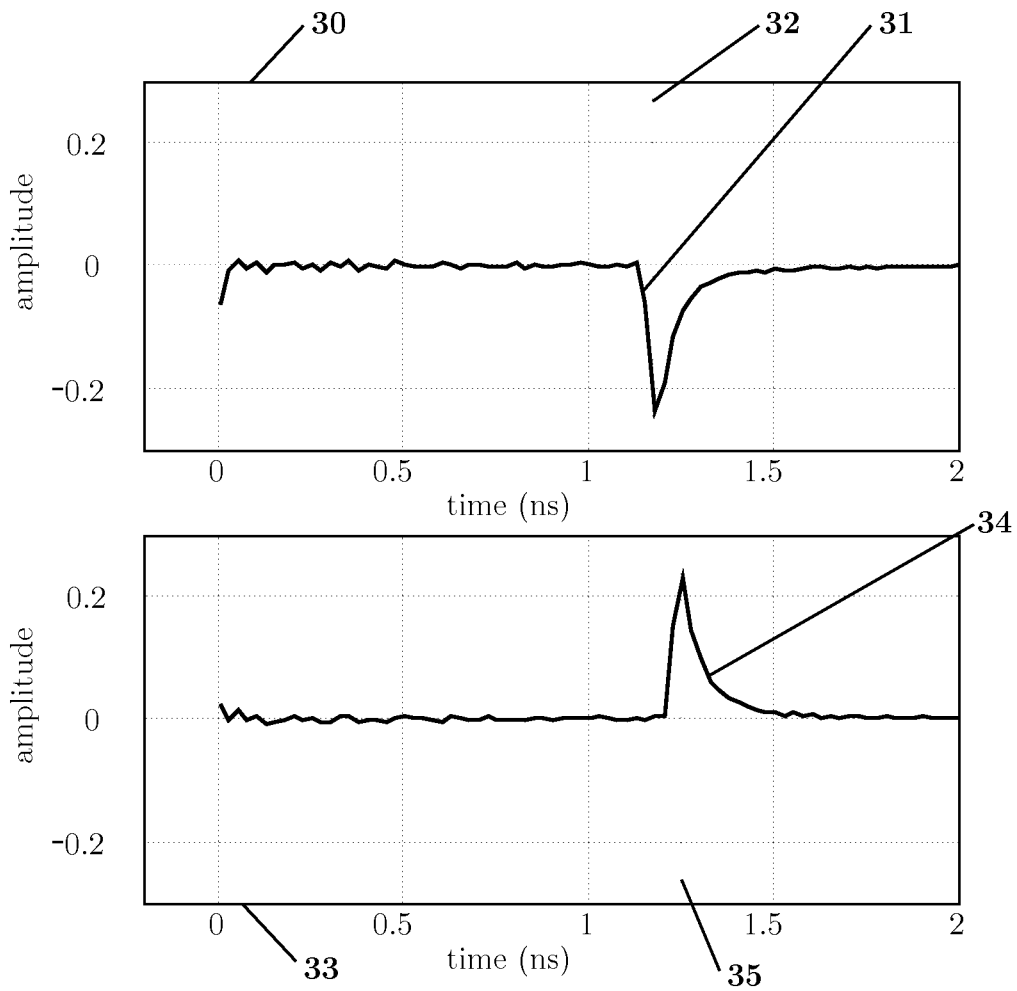
FIG. 8 are plots of time-domain waveforms utilized for isolating one variable ρ in the measurement problem.

FIG. 8 shows two exemplary plots. The top plot [30] is a plot of the IDFT of the differential-mode measurement of the trace characterization structure with the probe de-embedded. Here one can see the differential-mode time-domain waveform [31] showing a small bump downward at time zero, a substantially smooth area and a large downward bump at 1.175 ns denoted by a marker [32]. The small downward bump at time zero is indicative of an impedance discontinuity between the reference impedance (50Ω single-ended or 100Ω differential) and the differential-mode trace and the fact that it's downward indicates that the differential-mode characteristic impedance is less than 100Ω. The large downward bump at 1.175 ns locates the termination. Because the termination is for the most part a straight thru single-ended element, it represents a differential short, hence the large spike downward. The bottom plot [33] is a plot of the IDFT of the common-mode measurement of the trace characterization structure with the probe de-embedded. Here one can see the common-mode time-domain waveform [34] showing a tiny bump upward at time zero, a substantially smooth area and a large upward bump at 1.25 ns denoted by a marker [35]. The tiny upward bump at time zero is indicative of an impedance discontinuity between the reference impedance (50Ω single-ended or 25Ω common-mode) and the common-mode trace and the fact that it's tiny and upward indicates that the common-mode characteristic impedance is slightly more than 25Ω. The large upward bump at 1.25 ns locates the termination. Because the straight thru single-ended element represents an open to a common-mode signal component, it creates the large upward spike. Note that the location in time of the termination is different for the differential- and common-modes which indicates a different mode propagation velocity and is indicative of coupling in the single-ended trace structure of the DUT.

For a given mode, the termination can be grossly located by simply searching the waveform for the minimum value (for the differential-mode) or the maximum value (for the common-mode). Trimming the waveform to somewhat shorter than the termination location (like preferably 80%) and computing the DFT of the trimmed waveform provides a very good approximation of ρ as a function of frequency because it emulates the situation outlined in the limits of (9) and (10) because it simulates the condition in which the line is terminated in the line characteristic impedance and simultaneously simulates the condition in which the line is infinitely long. We call m̂ the trimmed version of m. It has been found by the inventors that the four inch lines generally used with SE2DIL are fine for this approximation, but any other appropriate lines may be employed.

Now that ρ has been determined in addition to C and M for a given frequency and mode, one may return to (8) and compute L according to (11):

$$L^2 = \frac{(1-\rho C)(M-\rho)}{(1-\rho M)(C-\rho)} \quad (11)$$

To compute L, one needs to compute a square root of a complex number which must be performed carefully. The range of the principle branch of the complex square root is $\pm\pi/2$ and the result should go between $\pm\pi$ so one needs some sort of phase unwrapping algorithm. The simplest way to deal with this is to use the value of $T_d$ which can be estimated from m and multiply the right side of (11) by $e^{j2\pi fT_d}$ (remembering that $T_d$ is the time between the first and second reflection, but twice the electrical length), unwrap the phase on $\pm\pi$ boundaries, compute the square root, and then multiply again by $$e^{j2\pi f \frac{T_d}{2}}$$

to put the delay back in. With the knowledge of these unwrapping complexities and that other unwrapping methods can be used, one can write generally (12):

$$L \approx e^{-2\pi f \frac{T_d}{2}} \sqrt{\frac{(1-\rho C)(M-\rho)}{(1-\rho M)(C-\rho)} e^{2\pi fT_d}} \quad (12)$$

To summarize the steps followed to this point, the process started with at least one-port measurements of one mode, usually the differential-mode of the trace structure. These measurements were taken for a number of predetermined frequency points. These measurements can be taken directly in the mode of interest or converted from single-ended or other measurements. These measurements were taken in a manner such that the probe was de-embedded or calibrated out of the measurement. The process also started with one-port measurements of one mode of the termination. These measurements were taken for a number of predetermined frequency points. These measurements were taken directly in the mode of interest or converted from single-ended or other measurements. These measurements were taken in a manner such that the probe was de-embedded or calibrated out of the measurement. Alternatively, the termination was obtained from simulation, or idealized or obtained through some other method, but the point is that the s-parameters in the mode of interest are determined. Given now one-port s-parameters of the trace structure and termination in at least one mode at predetermined frequency points, the reflection coefficient for the mode of interest ρ at least one frequency point is determined. Preferably the reflection coefficients are calculated at many frequencies and are calculated from the time-domain waveform corresponding to the one-port s-parameters of the trace structure by limiting the time length to remove the reflection caused by the termination and converting back to the frequency domain. Given now the reflection coefficient for at least one frequency point, at least the loss characteristic which is the magnitude of L in (11) is computed for the frequency point. Preferably, the loss and delay characteristics for the mode of interest encapsulated in the complex L at all of the predetermined frequencies are calculated using methods to preserve the phase information such as shown in (12).

The determination of ρ and L for multiple modes allows the determination of a complete set of s-parameters. The s-parameters for a given mode at a given frequency corresponding to the model shown in FIG. 6 with a frequency dependent ρ and L are described by (13):

$$S = \frac{1}{1-\rho^2 L^2}\begin{pmatrix} \rho(1-L^2) & L(1-\rho^2) \\ L(1-\rho^2) & \rho(1-L^2) \end{pmatrix} \quad (13)$$

It is important to note that (13) applies to any mode given that ρ and L are in that mode. It even applies to a single-ended two-port line.

If one defines $\rho_d$ and $L_d$ as describing the differential-mode transmission line and $\rho_c$ and $L_c$ as describing the common-mode transmission line, then the full mixed-mode s-parameters of the DUT are given by (14):

$$S = \begin{pmatrix} \frac{\rho_d(1-L_d^2)}{1-\rho_d^2 L_d^2} & \frac{L_d(1-\rho_d^2)}{1-\rho_d^2 L_d^2} & 0 & 0 \\ \frac{L_d(1-\rho_d^2)}{1-\rho_d^2 L_d^2} & \frac{\rho_d(1-L_d^2)}{1-\rho_d^2 L_d^2} & 0 & 0 \\ 0 & 0 & \frac{\rho_c(1-L_c^2)}{1-\rho_c^2 L_c^2} & \frac{L_c(1-\rho_c^2)}{1-\rho_c^2 L_c^2} \\ 0 & 0 & \frac{L_c(1-\rho_c^2)}{1-\rho_c^2 L_c^2} & \frac{\rho_c(1-L_c^2)}{1-\rho_c^2 L_c^2} \end{pmatrix} \quad (14)$$

The mixed-mode s-parameters in (14) can be converted to single-ended s-parameters using (4). Because of the symmetries already imposed, these single-ended s-parameters will have the form in (15).

$$\begin{pmatrix} S_{11} & S_{12} & S_{13} & S_{14} \\ S_{21} & S_{22} & S_{23} & S_{24} \\ S_{31} & S_{32} & S_{33} & S_{34} \\ S_{41} & S_{42} & S_{43} & S_{44} \end{pmatrix} = \begin{pmatrix} x_1 & x_2 & x_3 & x_4 \\ x_2 & x_1 & x_4 & x_3 \\ x_3 & x_4 & x_1 & x_2 \\ x_4 & x_3 & x_2 & x_1 \end{pmatrix} \quad (15)$$

(15) says that there are only four values $x_1$, $x_2$, $x_3$, and $x_4$ that make up the single-ended s-parameters. As an optional step, these s-parameters can be fit to the measurement made of the trace characterization structure (with the probe de-embedded) to refine the calculation. To do this, one may solve the flow diagram in FIG. 3 to obtain the solution (16) for the nodes as a function of the unknown DUT s-parameters and the known termination element:

$$\begin{pmatrix} 1 & 0 & 0 & 0 & 0 & 0 & 0 & 0 \\ -x_1 & 1 & -x_3 & 0 & 0 & -x_2 & 0 & -x_4 \\ 0 & 0 & 1 & 0 & 0 & 0 & 0 & 0 \\ -x_3 & 0 & -x_1 & 1 & 0 & -x_4 & 0 & -x_2 \\ -x_2 & 0 & -x_4 & 1 & 01 & -x_1 & 0 & -x_3 \\ 0 & 0 & 0 & 0 & -C_{11} & 1 & C_{12} & 0 \\ -x_4 & 0 & -x_2 & 1 & 0 & -x_3 & 01 & -x_1 \\ 0 & 0 & 0 & 0 & -C_{21} & 1 & C_{22} & 0 \end{pmatrix} \begin{pmatrix} n_1 \\ n_2 \\ n_3 \\ n_4 \\ n_5 \\ n_6 \\ n_7 \\ n_8 \end{pmatrix} = \begin{pmatrix} e_1 \\ 0 \\ e_2 \\ 0 \\ 0 \\ 0 \\ 0 \\ 0 \end{pmatrix} \quad (16)$$

(16) can be expressed as (17):

$$Gn = e \quad (17)$$

It is advantageous to reorder the nodal equations to arrange the nodes representing measured reflected waves $n_2$ and $n_4$ in the top two nodes and the measured incident waves $n_1$ and $n_3$ in the next two nodes. This is accomplished through the following permutation matrix in (18):

$$P = \begin{pmatrix} 0 & 1 & 0 & 0 & 0 & 0 & 0 & 0 \\ 0 & 0 & 0 & 1 & 0 & 0 & 0 & 0 \\ 1 & 0 & 0 & 0 & 0 & 0 & 0 & 0 \\ 0 & 0 & 1 & 0 & 0 & 0 & 0 & 0 \\ 0 & 0 & 0 & 0 & 1 & 0 & 0 & 0 \\ 0 & 0 & 0 & 0 & 0 & 0 & 1 & 0 \\ 0 & 0 & 0 & 0 & 0 & 1 & 0 & 0 \\ 0 & 0 & 0 & 0 & 0 & 0 & 0 & 1 \end{pmatrix} \quad (18)$$

Using (18), one can see (19):

$$Pn = (n_2 n_4 n_1 n_3 n_5 n_7 n_6 n_8)^T \quad (19)$$

Therefore, one can rewrite (17) as (20)

$$PGP^T Pn = Pe \quad (20)$$

(20) can be solved for the nodal values as in (21):

$$n' = Pn = [PGP^T]^{-1} Pe \quad (21)$$

Therefore one can write the solution in block matrix form as in (22):

$$\begin{pmatrix} F \\ I \\ A \\ B \end{pmatrix} = [PGP^T]^{-1} \begin{pmatrix} 0_2 \\ I_2 \\ 0_2 \\ 0_2 \end{pmatrix} \quad (22)$$

In (22), F is a 2×2 block matrix representing the measured s-parameters of the system, $I_2$ is a 2×2 identity block matrix, $0_2$ is a 2×2 block matrix of zeros and A and B are 2×2 block matrices representing incident and reflected waves on the termination structure.

Remember that G contains both the unknown s-parameters and the known termination structure s-parameters.

The unknown s-parameters can be solved in a nonlinear fashion using the Levenberg-Marquardt algorithm (from Donald Marquardt, "An Algorithm for Least-Squares Estimation of Nonlinear Parameters". SIAM Journal on Applied Mathematics 11 (2): 431-441, 1963 and K. Madsen, H. B. Nielsen, O. Tingleff, "Methods for Nonlinear Least Squares Problems", 2nd Edition, April 2004).

One may define the column extraction operator which serves to extract column m as (23):

$$\begin{pmatrix} S_{11} & S_{12} & \cdots & S_{1P} \\ S_{21} & S_{22} & \cdots & S_{2P} \\ \vdots & \vdots & \ddots & \vdots \\ S_{P1} & S_{P2} & \cdots & S_{PP} \end{pmatrix}_{*m} = \begin{pmatrix} S_{1m} \\ S_{2m} \\ \vdots \\ S_{Pm} \end{pmatrix} \quad (23)$$

One may define the row extraction operator which serves to extract row m as (24):

$$\begin{pmatrix} S_{11} & S_{12} & \cdots & S_{1P} \\ S_{21} & S_{22} & \cdots & S_{2P} \\ \vdots & \vdots & \ddots & \vdots \\ S_{P1} & S_{P2} & \cdots & S_{PP} \end{pmatrix}_{m*} = (S_{m1} \; S_{m2} \; \cdots \; S_{mP}) \quad (24)$$

One may define the Hermitian operator as the conjugate transpose such that:

$$\begin{pmatrix} S_{11} & S_{12} & \cdots & S_{1P} \\ S_{21} & S_{22} & \cdots & S_{2P} \\ \vdots & \vdots & \ddots & \vdots \\ S_{P1} & S_{P2} & \cdots & S_{PP} \end{pmatrix}^H = \begin{pmatrix} S_{11}^* & S_{21}^* & \cdots & S_{P1}^* \\ S_{12}^* & S_{22}^* & \cdots & S_{P2}^* \\ \vdots & \vdots & \ddots & \vdots \\ S_{1P}^* & S_{2P}^* & \cdots & S_{PP}^* \end{pmatrix} \quad (25)$$

Given this defined notation, one may define a function that returns what the measured s-parameters would be if $x = (x_1 \; x_2 \; x_3 \; x_4)^T$ (represented the s-parameters of the unknown DUT. We also introduce the function $G(x,C) = G$ which fills in the matrix G as a function of x and the s-parameters of the termination structure. In other words, given a set of s-parameters x, f(x) shown in (26) produces what the two-port measurement of the trace measurement structure would be:

$$f(x, C) = \left[ [PG(x, C)P^T]^{-1} \begin{pmatrix} 0_2 \\ I_2 \\ 0_2 \\ 0_2 \end{pmatrix} \right]_1 \quad (26)$$

The goal is therefore to find the values of x such that f(x) differs from $\vec{M}$ by as little as possible (i.e. they match in a least-squares sense). Given this, one may take a guess at what x (the s-parameters) might be and form the residual vector from the guess and the actual measurement M of the trace structure as in (27). The good news is that there is already a very good guess or estimate of x as calculated in the preceding discussion.

$$r = \overrightarrow{f(x,C)} - \vec{M} \quad (27)$$

Then one may form a weights matrix that forms the weight of measurement $[\vec{M}]_k$ in the fit, where k, n ∈ 1 ... K and K = 4 representing the number of unknown s-parameters. The weights are arbitrarily chosen as in (28)

$$W = I_4 \quad (28)$$

Then one may form the Jacobian matrix J as in (29) where $J_{k,n}$ is the partial derivative of the $k^{th}$ element of $\overrightarrow{f(x)}$ with respect to the $n^{th}$ element of x:

$$J_{k,n} = \left[\overrightarrow{\frac{\partial f(x,C)}{\partial x_n}}\right]_k \approx \left[\overrightarrow{\frac{f(x+\delta_{*n}, C) - f(x,C)}{\epsilon}}\right]_k \quad (29)$$

In (29), one may form an approximation to the partial derivatives, but an analytic form can be used as well. To form the approximation, if desired, one may choose column n of δ as shown in (30) which is the 4×4 element identity matrix multiplied by some arbitrary, but generally small value of ϵ, like 0.001.

$$\delta = I_4 \epsilon \quad (30)$$

Then one may form the approximate Hessian matrix as in (31):

$$H = J^T W J \quad (31)$$

To implement Levenberg-Marquardt, one may create a matrix D as in (32) which contains the diagonal elements of H, but is zero elsewhere:

$$D_{k,k} = R_{k,k} \quad (32)$$

Levenberg-Marquardt steers the fit between Newton-Gauss convergence and a gradient walk through the use of the variable λ. When λ is zero, one has Newton-Gauss convergence. When λ is infinity, one has have a gradient walk with an infinitesimally small step size. λ starts out as an arbitrary value, like 100. One may define Δx as the estimate of the amount that our guess at x is off by in (33):

$$\Delta x = [H + \lambda D]^{-1} J^T W r \quad (33)$$

The plan is to subtract Δx from x in the assumption that this will get closer to the correct value of x. In order to check this, one may compute the original variance as (34):

$$\sigma^2 = \frac{r^H W r}{K} \quad (34)$$

One may compute the new variance that we would get with the application of Δx as (35):

$$\sigma_{new}^2 = \frac{\left[\overrightarrow{f(x-\Delta x, C)} - \overrightarrow{M}\right]^H W \left[\overrightarrow{f(x-\Delta x, C)} - \overrightarrow{M}\right]}{K} \quad (35)$$

If $\sigma_{new} < \sigma$, then the step succeeded and we subtract Δx from x and decrease λ to favor Newton-Gauss convergence on the next iteration. Usually, in this case, we divide λ by 10. Otherwise, if the step failed to reduce the variance, one may keep the old value of x and increase λ to favor the gradient method with a smaller step size on the next iteration. With this new value of x which is a better estimate of the s-parameters, one may go back to the residual calculation step with the new value of x and do it again. One may stop when either the variance is low enough, the variance stops changing significantly, or the value of λ moves outside some predetermined upper and lower limit.

In this manner, one may can refine the estimate of the s-parameters of the DUT.

With this, the measure of the goodness of the assumptions of reciprocity and symmetry can be tested through the final value of σ which should ideally become zero if we obtained the values of the DUT perfectly such that f(x)=M. If the variance becomes zero, it would mean that one has found the DUT perfectly and that all of our assumptions of reciprocity and symmetry were perfectly correct. In practice, there will be slight errors in the assumptions of symmetry, in the measurement of M, and in the knowledge of C, so one will want to use an arbitrary threshold on σ to determine the goodness of the values obtained.

At this point, one will have refined single-ended s-parameters of the DUT by applying our refined x to (15). One can convert these s-parameters back to mixed-mode using (3).

Although the goal of characterizing the DUT from an s-parameter measurement perspective has been accomplished, there are other goals of PCB measurements that are accomplished by converting the now obtained s-parameter data into measurement values used for pass-fail testing and other basic characterization. A few will be discussed here, but keep in mind that this list is in no-way exhaustive.

The differential- and common-mode DUT characteristic impedance can be calculated utilizing the impedance profile, as outlined in U.S. patent application Ser. No. 13/163,914 filed to P. Pupalaikis entitled "Method For De-embedding in Network Analysis". The impedance profile provides the characteristic impedance as a function of time (i.e. electrical length into the DUT). Choosing an arbitrary location allows calculation of the characteristic impedance, a useful characteristic The impedance profile can also be approximated by integrating the differential-mode waveform [31] and the common-mode waveform [34] and converting to impedance using (6).

The loss is calculated directly in an impedance normalized environment and is already encapsulated in L. In other words, if L is plotted over frequency, it provides the true loss characteristic of the trace without the effects of the impedance discontinuity.

It is useful to further fit the loss to a curve that is preferably a function of the square-root of frequency (to capture skin-effect type loss characteristics) and a linear function of frequency (to capture dielectric type loss characteristics). This is done by, given N+1 frequency points, $n \epsilon 0 \ldots N$ where $f_n$ is the frequency in GHz of element n and $V_n = 20 \text{ Log}(|L_n|)$ is the magnitude of the loss in decibels where $L_n$ is the loss calculated in the preceding discussion at frequency $f_n$. We then compute the values in (36), (37) and (38):

$$H_{n,0} = -f_n \quad (36)$$

$$H_{n,1} = -\sqrt{f_n} \quad (37)$$

$$x = [H^T H]^{-1} H V \quad (38)$$

(38) is a vector such that $x_o$ is the loss coefficient in dB per GHz and $x_1$ is the loss coefficient in dB per root-GHz. If one knows the length of the DUT, these can be converted further to a loss per inch. The fitted loss is therefore calculated as:

$$V'_n = x_0 f_n + x_1 \sqrt{f_n} \quad (39)$$

Figure 9:
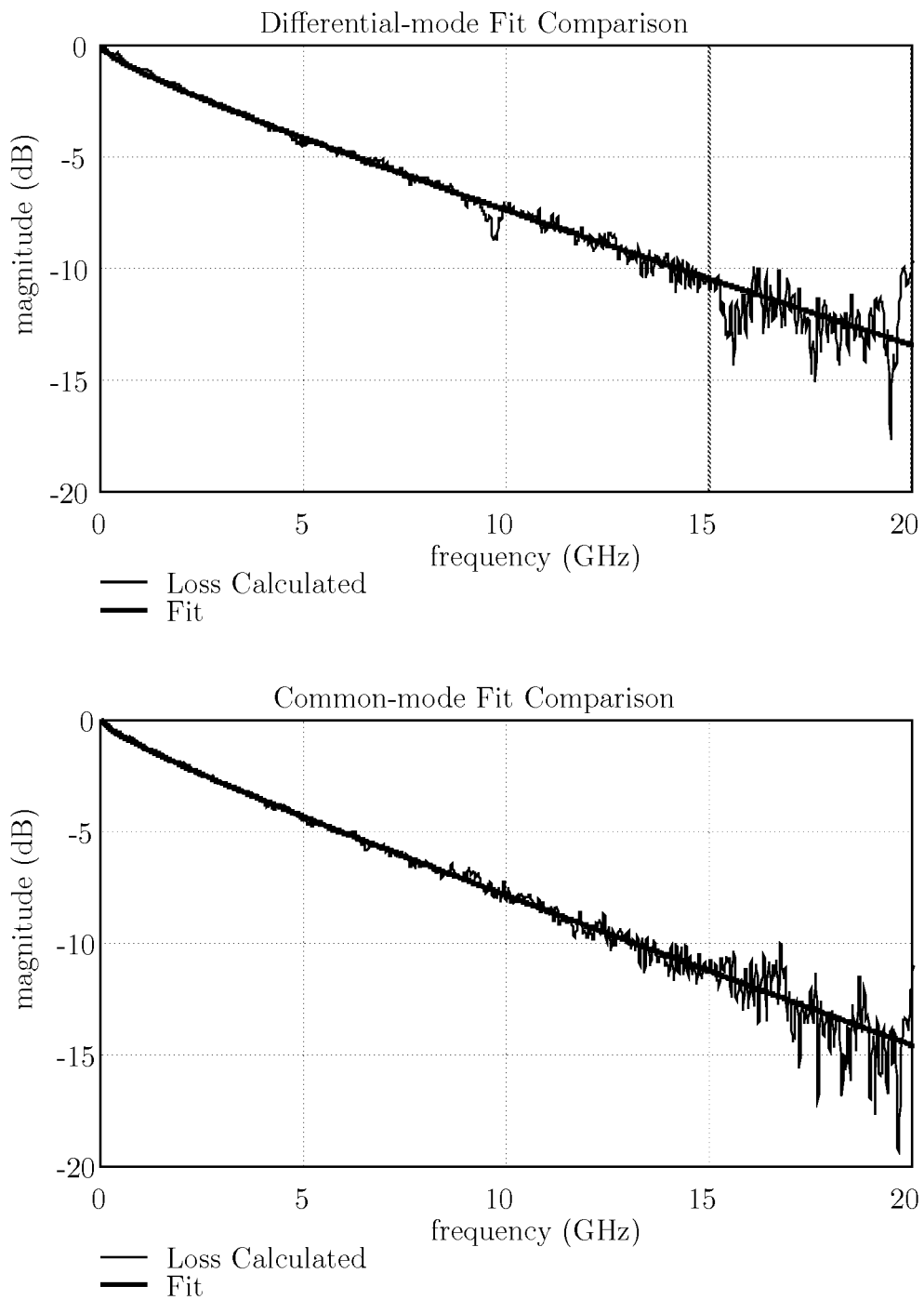
FIG. 9 are plots of calculated and fitted differential- and common-mode exemplary loss characteristics.

An example of loss fit is shown in FIG. 9 where the differential-mode loss is calculated as 0.506 dB/GHz and 0.753 dB/√GHz and the common-mode loss is calculated as 0.586 dB/GHz and 0.649 dB/√GHz. Any desired losses, like loss at a particular frequency for a given mode can be calculated from the fitted curve.

The electrical length for each mode can be found by taking half of the values at the markers [32] and [35] and if the length is known, propagation velocities for each mode can be found. These calculations can be refined using group delay calculations of the phase of L. Given propagation velocity, and impedance, one can calculate the inductance and capacitance per unit length and derive all sorts of board properties that are known to those skilled in the art of SI.

While not shown, one could also fit values of impedance and fitted loss characteristics as calculated in the preceding paragraphs to the measured characteristics of the DUT to fit an idealized model instead of the refined single-ended s-parameter calculation shown here. This fit would proceed in a similar manner with the values that were fitted for the single-ended s-parameters x replaced with the fitted or calculated values of $\rho$ and L to obtain a least-squares fit to an ideal mode.

While in a preferred embodiment, differential-mode measurements of the termination structure and the trace characterization structure are used to determine differential-mode loss characteristics, it should be appreciated that in fact other modes may be measured and loss characteristics at these other modes may be determined. Furthermore, it is well known to those skilled in the art that in many cases, modal measurement may be converted to other modes and that the measurements of the termination structure, the trace characterization structure may be made in a variety of the same or different modes and that the determination of the loss characteristics can be made for the same or different modes as well.

It will thus be seen that the objects set forth above, among those made apparent from the preceding description, are efficiently attained and, because certain changes may be made in carrying out the above method and in the construction(s) set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed:

1. A method for characterizing a device under test in a trace structure, the trace structure comprising:
    a probing structure;
    the device under test; and
    a termination structure;
    wherein the probing structure is connected to one side of the device under test and the termination structure is connected to the other side of the device under test, the method comprising the steps of:
    determining the s-parameters of the termination structure for a first mode at at least one frequency;
    determining the s-parameters of the trace structure for a second mode at a plurality of frequencies;
    calculating a time limited time-domain waveform in accordance with the s-parameters of the trace structure;
    determining a reflection coefficient at the least one frequency in accordance with the time limited time-domain waveform; and
    determining a loss characteristic of the device under test for a third mode at the at least one frequency in accordance with the reflection coefficient, the s-parameters of the termination structure, and the at least one frequency.

2. The method according to claim 1 wherein the first mode, the second mode and the third mode are the same mode.

3. The method according to claim 1 wherein at least two of the first mode, the second mode and the third mode are the same mode.

4. The method according to claim 1 wherein the first mode, the second mode and the third mode are the different modes.

5. The method according to claim 1 wherein the step of determining the s-parameters of the trace structure at the plurality of frequencies comprises the steps of:
    determining the single-ended s-parameters of the trace structure at the plurality of frequencies; and
    converting the single-ended s-parameters of the trace structure to the s-parameters of the trace structure for a different mode at the plurality of frequencies.

6. The method according to claim 5 wherein the step of determining the s-parameters of the trace structure at the plurality of frequencies comprises measuring the single-ended s-parameters of the trace structure at the plurality of frequencies.

7. The method according to claim 1 wherein the step of determining the s-parameters of the trace structure at the plurality of frequencies comprises measuring the s-parameters of the trace structure at the plurality of frequencies.

8. The method according to claim 1 wherein the step of determining the s-parameters of the termination structure at the at least one frequency comprises the steps of:
    determining the single-ended s-parameters of the termination structure for the at least one frequency; and
    converting the single-ended s-parameters of the termination structure to the s-parameters of the termination structure for a different mode at the at least one frequency.

9. The method according to claim 8 wherein the step of determining the s-parameters of the trace structure at the plurality of frequencies comprises measuring the single-ended s-parameters of the trace structure at a plurality of frequencies.

10. The method according to claim 1 wherein the step of determining the s-parameters of the termination structure at the at least one frequency comprises measuring the s-parameters of the termination structure for a mode at at least one frequency.

11. The method according to claim 1 wherein the step of calculating the time limited time-domain waveform in accordance with the s-parameters of the trace structure comprises the steps of:
    calculating a time-domain waveform in accordance with the s-parameters of the trace structure;
    determining the time location of the reflection from the termination structure in the time-domain waveform; and
    determining a time limited time-domain waveform in accordance with the time-domain waveform and the time location.

12. The method according to claim 1 further comprising the steps of:
    determining reflection coefficients at the plurality of frequencies in accordance with the time limited time-domain waveform;
    determining loss characteristics of the device under test at the plurality of frequencies in accordance with the reflection coefficients at the plurality of frequencies, the s-parameters of the termination structure at the plurality of frequencies, and the plurality of frequencies; and
    fitting a function in accordance with the loss characteristics at the plurality of frequencies.

13. The method according to claim 12 wherein the function comprises a term that is linear in frequency.

14. The method according to claim 12 wherein the function comprises a term that is linear in the square-root of frequency.

15. The method according to claim 1 further comprising the step of determining a delay characteristic at the at least one frequency in accordance with the reflection coefficient, the s-parameters of the termination structure, and the at least one frequency.

16. The method according to claim 15 further comprising the steps of:
- determining a complex thru coefficient in accordance with the delay characteristic at the at least one frequency and the loss characteristic at the at least one frequency; and
- determining the s-parameters of the device under test at the at least one frequency in accordance with the reflection coefficient at the at least one frequency and the complex thru coefficient at the at least one frequency.

17. The method according to claim 16 further comprising the step of determining the single-ended s-parameters of the device under test at the at least one frequency in accordance with the s-parameters of the device under test at the at least one frequency.

18. The method according to claim 17 further comprising the step of fitting the single-ended s-parameters of the device under test to the s-parameters of the trace structure at the at least one frequency.

\* \* \* \* \*